United States Patent
Lin et al.

(10) Patent No.: US 9,640,554 B2
(45) Date of Patent: *May 2, 2017

(54) PIXEL STRUCTURE

(71) Applicant: Au Optronics Corporation, Hsinchu (TW)

(72) Inventors: Yi-Cheng Lin, Changhua County (TW); Yu-Chi Chen, Yilan County (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/468,349

(22) Filed: Aug. 26, 2014

(65) Prior Publication Data
US 2015/0340383 A1 Nov. 26, 2015

(30) Foreign Application Priority Data
May 22, 2014 (TW) .............................. 103117940 A

(51) Int. Cl.
H01L 27/12 (2006.01)
H01L 33/38 (2010.01)
H01L 27/32 (2006.01)

(52) U.S. Cl.
CPC ........ *H01L 27/1225* (2013.01); *H01L 27/124* (2013.01); *H01L 27/1255* (2013.01); *H01L 27/3244* (2013.01); *H01L 33/387* (2013.01); *H01L 2227/323* (2013.01)

(58) Field of Classification Search
None
See application file for complete search history.

(56) References Cited

U.S. PATENT DOCUMENTS

| 7,645,623 | B2 | 1/2010 | Cheng |
| 7,768,012 | B2 | 8/2010 | Cheng |
| 8,476,625 | B2 | 7/2013 | Kimura |
| 8,999,750 | B2 | 4/2015 | Kimura |
| 9,201,280 | B2 | 12/2015 | Kimura |
| 9,214,476 | B1 * | 12/2015 | Lin ..................... H01L 27/3276 |

(Continued)

FOREIGN PATENT DOCUMENTS

| TW | I316763 | 11/2009 |
| TW | 201036163 | 10/2010 |

(Continued)

*Primary Examiner* — Fernando L Toledo
*Assistant Examiner* — Valerie N Newton
(74) *Attorney, Agent, or Firm* — Jianq Chyun IP Office

(57) ABSTRACT

A pixel structure includes a semiconductor layer, an insulating layer, a first conductive layer, a second conductive layer, a passivation layer, and a first electrode layer. The semiconductor layer includes a first semiconductor pattern having a first source region, a first drain region, and a first channel region. The insulating layer is disposed on the semiconductor layer. The first conductive layer is disposed on the insulating layer and includes a first gate, a first source, a first drain, and a data line connected to the first source. The second conductive layer is disposed on the first conductive layer and includes a scan line. The passivation layer covers the first and second conductive layers and the semiconductor layer. The first electrode layer is disposed on the passivation layer and provides electrical connection to different layers.

15 Claims, 10 Drawing Sheets

(56) References Cited

U.S. PATENT DOCUMENTS

| | | |
|---|---|---|
| 2008/0128719 A1 | 6/2008 | Cheng |
| 2010/0072479 A1 | 3/2010 | Cheng |
| 2010/0140613 A1 | 6/2010 | Kimura |
| 2010/0193785 A1* | 8/2010 | Kimura ............................ 257/43 |
| 2013/0280858 A1 | 10/2013 | Kimura |
| 2014/0211118 A1* | 7/2014 | Zhou ..................... H01L 27/124 |
| | | 349/43 |
| 2015/0177543 A1 | 6/2015 | Kimura |

FOREIGN PATENT DOCUMENTS

| | | |
|---|---|---|
| TW | 201214714 | 4/2012 |
| TW | 201248846 | 12/2012 |
| WO | 2014047980 | 4/2014 |

* cited by examiner

PIXEL STRUCTURE

CROSS-REFERENCE TO RELATED APPLICATION

This application claims the priority benefit of Taiwan application serial no. 103117940, filed on May 22, 2014. The entirety of the above-mentioned patent application is hereby incorporated by reference herein and made a part of this specification.

BACKGROUND OF THE INVENTION

1. Field of the Invention

The invention generally relates to a pixel structure, in particular, to a pixel structure characterized by a high aperture ratio and the reduced number of photomasks.

2. Description of Related Art

An organic light emitting diode (OLED) panel is a type of self-luminous display device. It has the advantages of a wide viewing angle, low power consumption, a simplified manufacturing process, low production costs, a wide operating temperature range, high response speed, full color display, etc. Due to these advantages, the OLED panel is expected to become the mainstream product for the next generation of flat panel displays. In general, the OLED panel includes a plurality of pixel structures, and each pixel structure further includes a plurality of active devices (for example, thin film transistors) or passive devices (for example, resistors and capacitors), a cathode or an anode electrically connected to the active devices, and an organic light emitting layer disposed between the anode and the cathode.

The active devices of the pixel structure can be manufactured by applying indium-gallium-zinc oxide (IGZO) techniques. IGZO is a type of metal oxide that contains indium, gallium and zinc and has a carrier mobility that is ten times higher than amorphous silicon (a-Si). Such type of metal oxides can greatly increase the speed of charging or discharging the pixel electrode by the active device, hence achieving fast frame rates and allowing smoother animation playback. Currently, as to the top-gate type of the pixel structure, seven photomasks are often used to maintain a high aperture ratio of the pixel structure. The high aperture ratio can improve the overall light emitting efficiency of the panel, hence making the panel more power efficient. However, excessive use of photomasks will increase the production costs and simultaneously reduce the volume of production.

SUMMARY

Accordingly, the invention is directed to a pixel structure that can reduce the required number of photomasks while maintaining a high aperture ratio.

The pixel structure in an embodiment of the invention includes a semiconductor layer, an insulating layer, a first conductive layer, a second conductive layer, a passivation layer, and a first electrode layer. The semiconductor layer includes a first semiconductor pattern. The first semiconductor pattern has a first channel region, a first source region, and a first drain region. The insulating layer is disposed on the semiconductor layer. The first conductive layer is disposed on the insulating layer and includes a first gate, a first source, a first drain, and a data line connected to the first source. The second conductive layer is disposed above the first conductive layer and includes a scan line. The passivation layer covers the first conductive layer, the second conductive layer, and the semiconductor layer. The passivation layer has a first opening, a second opening, and a third opening. The first opening exposes the first source and the first source region of the first semiconductor pattern. The second opening exposes the first drain and the first drain region of the first semiconductor pattern. The third opening exposes the first gate and the scan line. The first electrode layer is disposed on the passivation layer. The first electrode layer fills into the first, second, and third openings, such that the first source and the first source region are electrically connected to each other, the first drain and first drain region are electrically connected to each other, and the first gate and the scan line are electrically connected to each other.

The pixel structure in an embodiment of the invention includes a scan line, a data line, a first active device, a passivation layer, a first connection structure, a second connection structure, a third connection structure, and a first electrode. The first active device is electrically connected to the scan line and data line. The first active device includes a first semiconductor pattern, an insulating layer, a first gate, a first source, and a first drain. The first semiconductor pattern has a first channel region, a first source region, and a first drain region. The insulating layer is disposed on the first semiconductor pattern. The first gate, the first source, and the first drain are disposed on the insulating layer. The passivation layer covers the first active device. The passivation layer has a first opening, a second opening, and a third opening. The first connection structure is disposed on the passivation layer to electrically connect the first source and first source region through the first opening. The second connection structure is disposed on the passivation layer to electrically connect the first drain and the first drain region through the second opening. The third connection structure is disposed on the passivation layer to electrically connect the first gate and the scan line through the third opening.

Based on the above, the passivation layer of the pixel structure in an embodiment of the invention has the first opening and the second opening exposing the first conductive layer and the semiconductor layer, and the third opening of the passivation layer exposes the first conductive layer and the second conductive layer. Moreover, the first electrode layer serves to bridge the semiconductor layer and the first conductive layer, bridge the first conductive layer and the second conductive layer, and bridge the semiconductor layer and the second conductive layer. Therefore, compared to the conventional production process, one photomask is omitted according to an embodiment of the invention.

In order to make the features and advantages of the invention more comprehensible, the invention is further described in detail in the following with reference to the embodiments and the accompanying drawings.

DESCRIPTION OF THE EMBODIMENTS

FIG. 1A to FIG. 1E are schematic top views of layers of a pixel structure according to an embodiment of the invention. FIG. 2A to FIG. 2E are schematic cross-sectional views of a pixel structure according to an embodiment of the invention. The cross-sectional views in FIG. 2A to FIG. 2E correspond to the section lines I1-I1', section lines I2-I2', section lines I3-I3', and section lines I4-I4' in FIG. 1A to FIG. 1E, respectively. The manufacturing process of the pixel structure is described in the following embodiment of the invention.

Figure 1A:
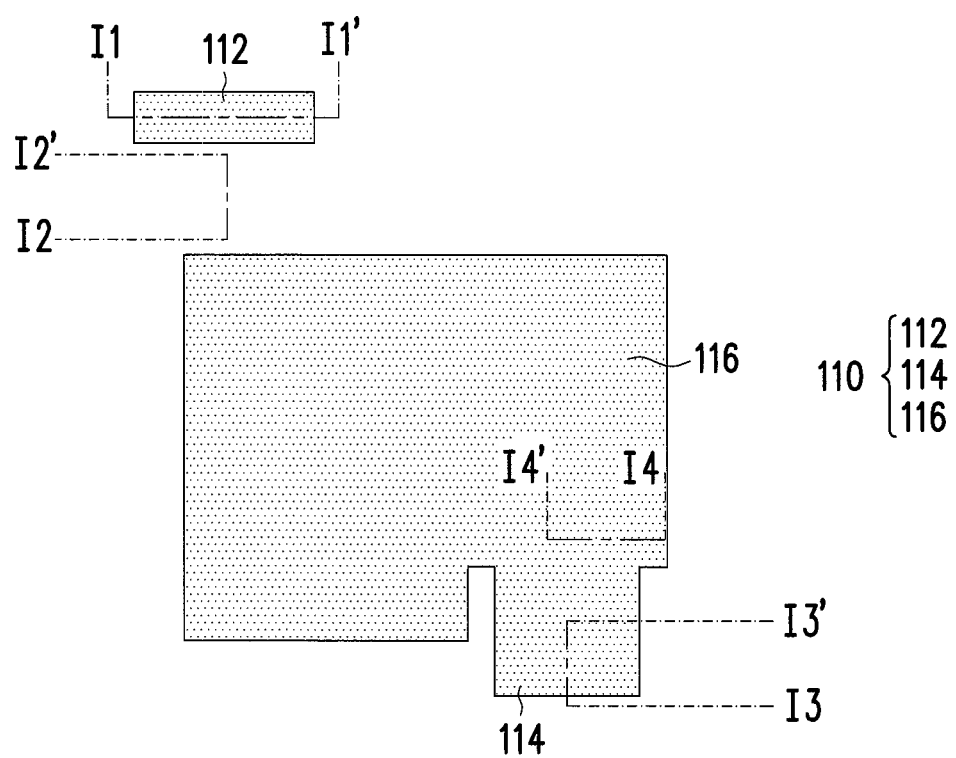
FIG. 1A to FIG. 1E are schematic top views of layers of a pixel structure according to an embodiment of the invention.
Figure 2A:
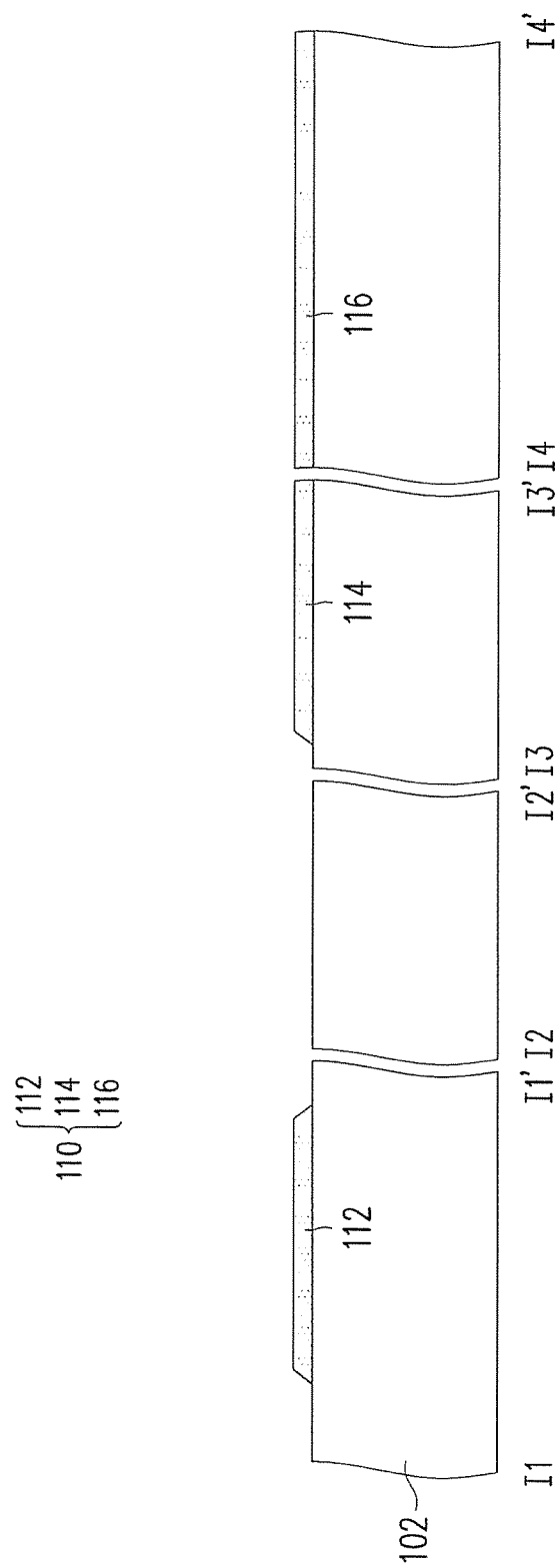
FIG. 2A to FIG. 2E are schematic cross-sectional views of a pixel structure according to an embodiment of the invention.

With reference to FIG. 1A and FIG. 2A, a substrate 102 is provided. The material of the substrate 102 can be glass, quartz, an organic polymer, or an opaque/reflective material (for example, a conductive material, metal, wafers, ceramic or any other suitable materials), or any other suitable materials. If a conductive material or metal is used, an insulating layer (not shown) is disposed on the substrate 102 to avoid the short-circuit problem.

Subsequently, a semiconductor layer 110 is formed on a top surface of the substrate 102. The method of forming the semiconductor layer 110 is, for example, forming a semiconductor material (not shown) through chemical vapor deposition (CVD) and performing a photolithography and etching process to define patterns, so as to form the semiconductor layer 110. More specifically, as shown in FIG. 1A, the semiconductor layer 110 has a first semiconductor pattern 112, a second semiconductor pattern 114, and a bottom electrode 116. The first semiconductor pattern 112 is separated from the second semiconductor pattern 114 and the bottom electrode 116. The semiconductor layer 110 is, for example, made of a metal oxide semiconductor material, such as indium-gallium-zinc oxide (IGZO), zinc oxide (ZnO), tin oxide (SnO), indium-zinc oxide (IZO), gallium-zinc oxide (GZO), zinc-tin oxide (ZTO), or indium-tin oxide (ITO).

An insulating layer (not shown) is formed on the semiconductor layer 110. The material of the insulating layer includes an inorganic material (for example, silicon oxide, silicon nitride, silicon oxynitride, any other suitable materials, or stacked layers of at least two of the above mentioned materials), an organic material, any other suitable materials, or the combination of the above.

Figure 1B:
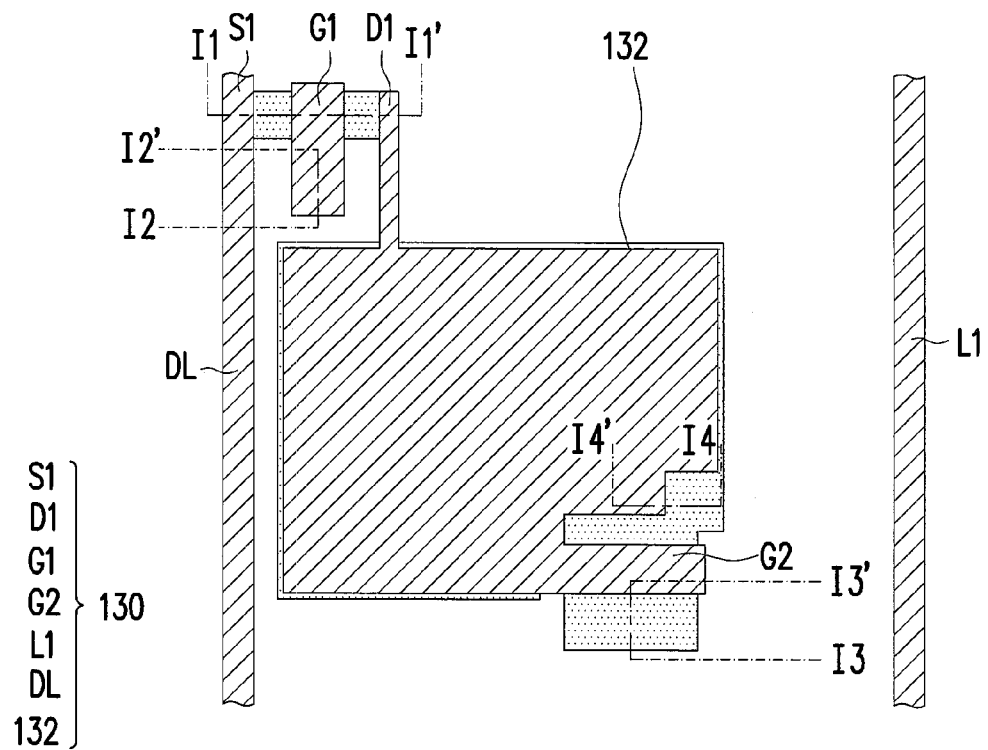
Figure 2B:
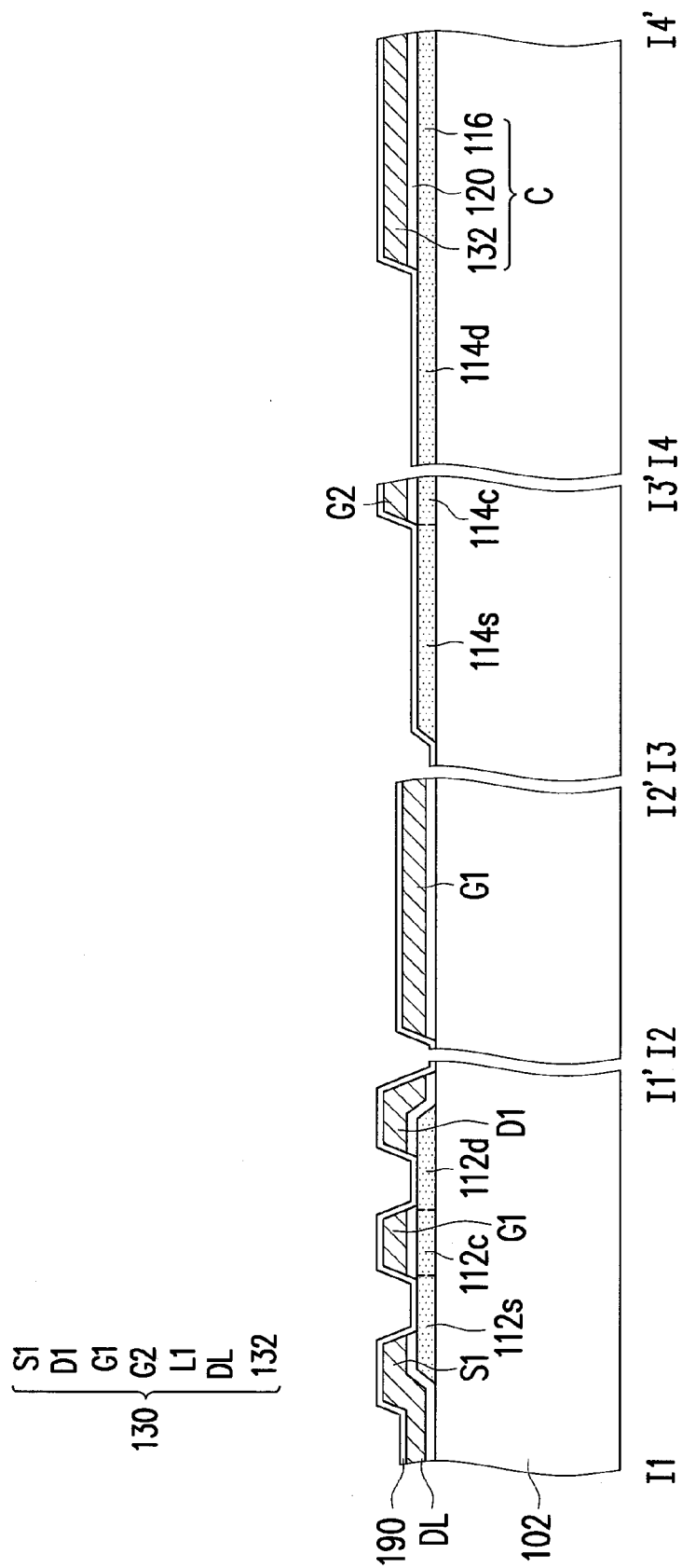

With reference to FIG. 1B and FIG. 2B, a first conductive layer 130 is formed on the insulating layer. The material of the first conductive layer 130 includes metals. The first conductive material 130 includes a first gate G1, a first source S1, a first drain D1, a data line DL, a top electrode 132, a first signal line L1, and a second gate G2. The first source S1 is connected to the data line DL. The first drain D1 is connected to the top electrode 132, and the top electrode 132 is connected to the second gate G2. As mentioned above, as the first gate G1 and the second gate G2 are disposed on the semiconductor layer 110, this type of active device is also called a top-gate type active device. In addition, the top electrode 132 of the first conductive layer 130 overlaps the bottom electrode 116 of the semiconductor layer 110 to form a capacitor C. The method of forming the first conductive layer 130 is, for example, forming a conductive material layer (not shown) on the insulating layer and simultaneously patterning the conductive material layer and the insulating layer, so as to form the first conductive layer 130 and the patterned insulating layer 120, as shown in FIG. 2B.

According to an embodiment, after forming the first conductive layer 130, an aluminum layer (not shown) is formed on the patterned insulating layer 120 and the first conductive layer 130. Subsequently, the aluminum layer is placed in an oxygen atmosphere for thermal annealing, and thereby the aluminum layer is oxidized to form an aluminum oxide ($Al_2O_3$) layer 190. During the thermal annealing process, in the contact region of the aluminum layer and the semiconductor layer 110, the aluminum atoms react with the semiconductor layer 110 and increase the conductivity of this region, and thereby a first source region 112s, a first drain region 112d, a second source region 114s, and a second drain region 114d are formed. In addition, the aluminum oxide layer 190 can serve as an insulating layer to insulate the first conductive layer 130 from the second conductive layer 140.

More specifically, after oxidizing the aluminum layer by performing the thermal annealing process, the first semiconductor patter 112 has a first channel region 112c, a first source region 112s, and a first drain region 112d. The second semiconductor pattern 114 has a second channel region 114c, a second source region 114s, and a second drain region 114d. The second drain 114d and the bottom electrode 116 are connected.

Figure 1C:
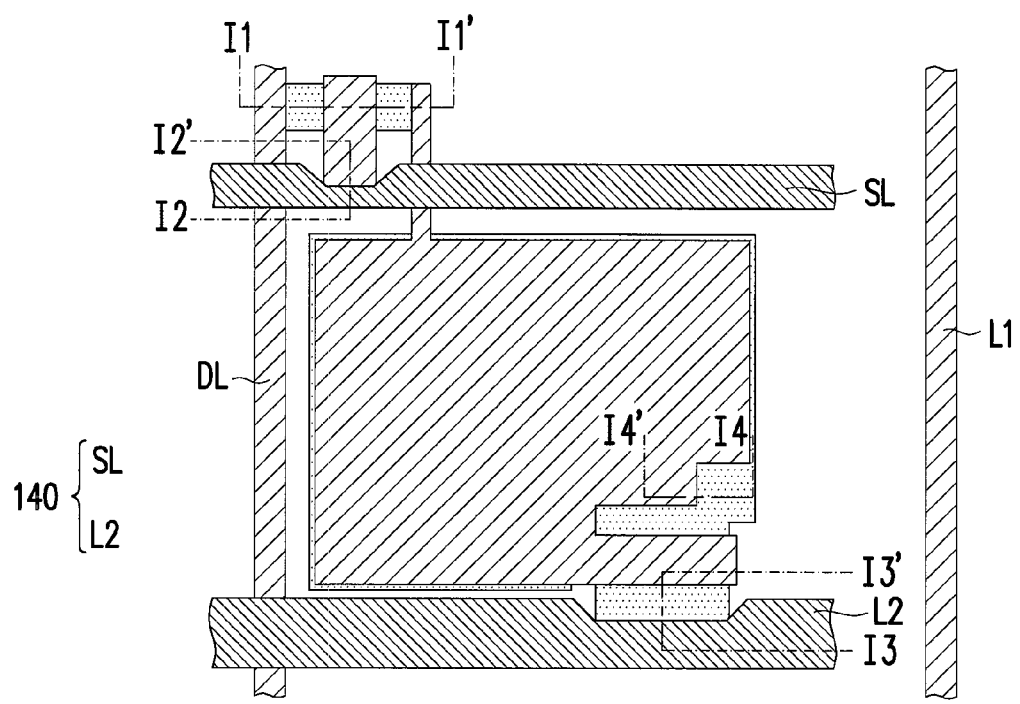
Figure 2C:
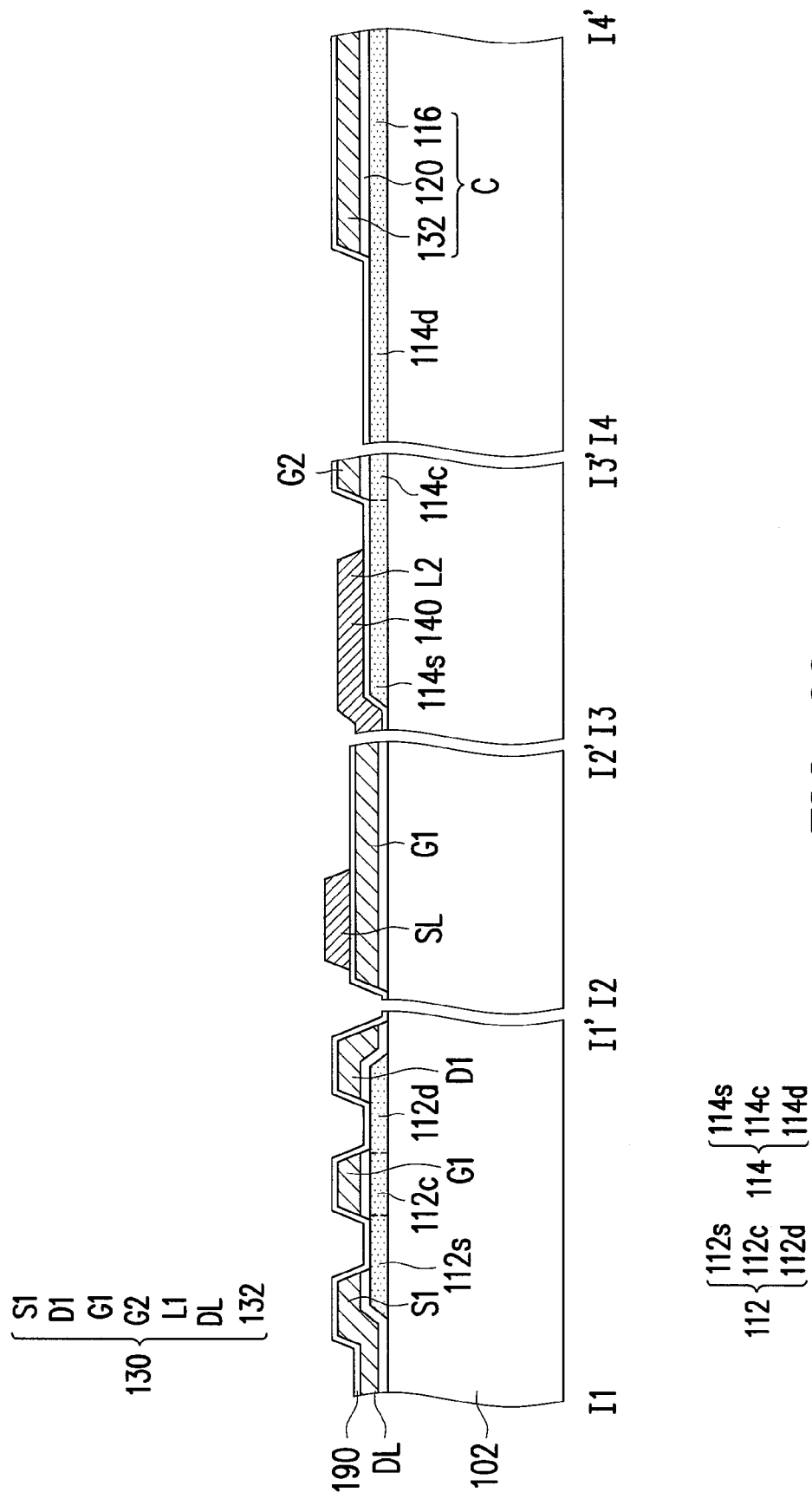

With reference to FIG. 1C and FIG. 2C, a second conductive layer 140 is formed on the aluminium oxide layer 190 (which is located above the first conductive layer 130). The second conductive layer 140 includes a scan line SL and a second signal line L2. The method of forming the second conductive layer 140 is, for example, forming a conductive material layer (not shown) and patterning the conductive material layer. As the aluminium oxide layer 190 provides insulation between the first conductive layer 130 and the second conductive layer 140, the overlapped regions of "the scan line SL and the second signal line L2" and "the data line DL and the first signal line L1" do not have electrical connection.

Figure 1D:
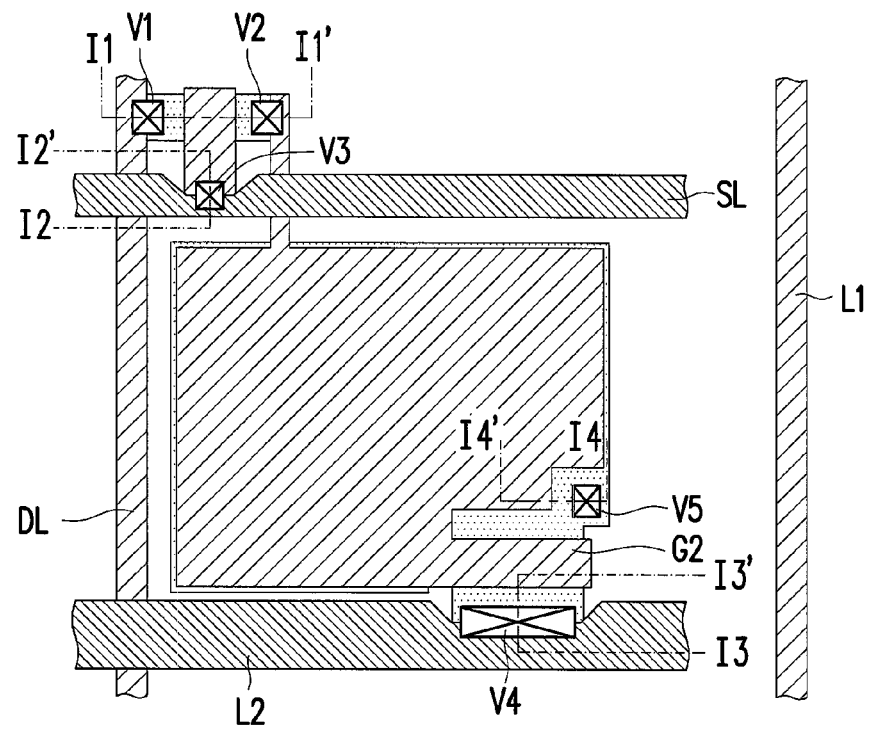
Figure 2D:
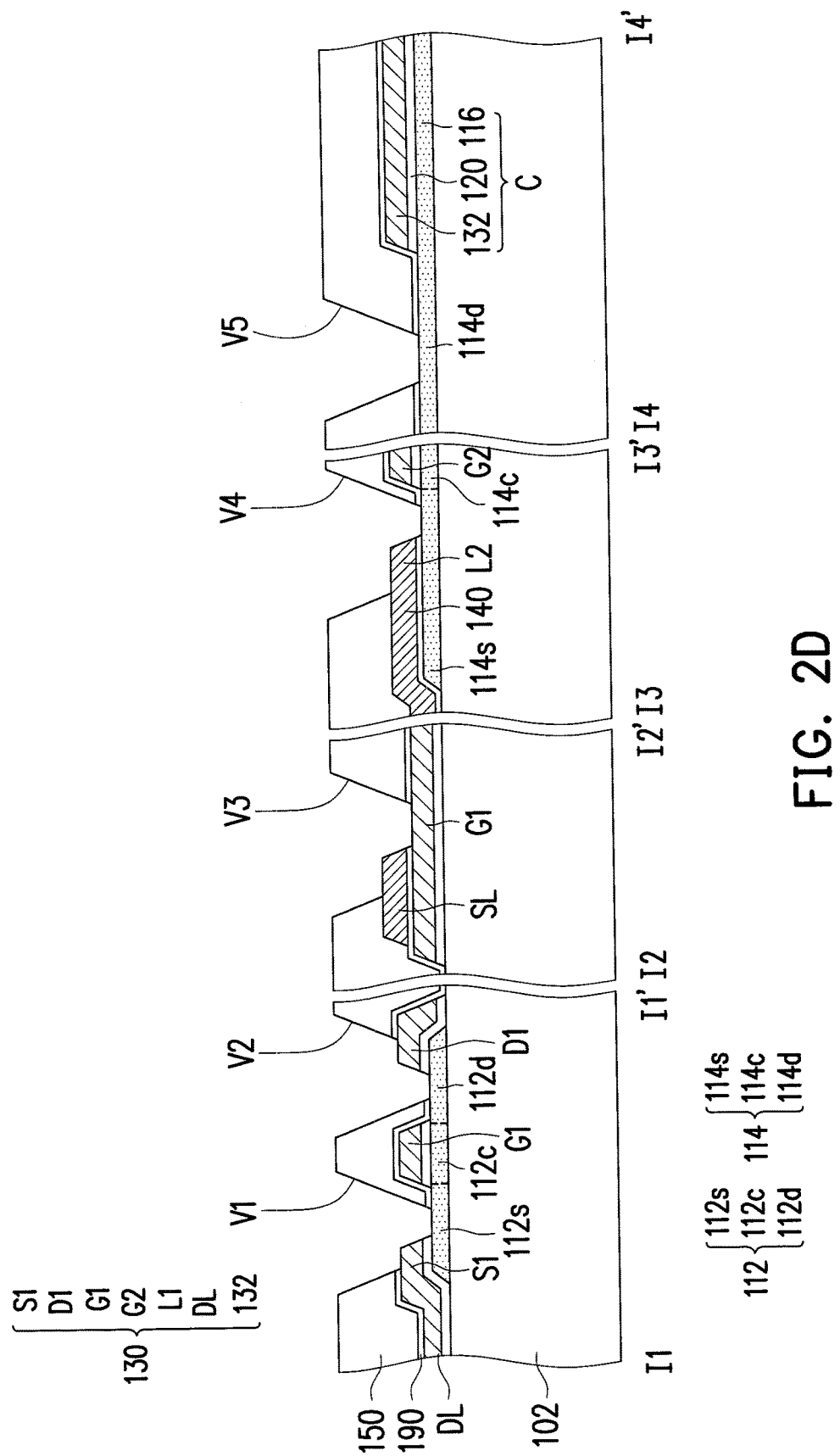

With reference to FIG. 1D and FIG. 2D, a passivation layer 150 is formed on the second conductive layer 140. The passivation layer 150 covers the first conductive layer 130, the second conductive layer 140, and the semiconductor layer 110. The passivation layer 150 has a first opening V1, a second opening V2, a third opening V3, a fourth opening V4, and a fifth opening V5. The first opening V1 exposes the first source S1 and the first source region 112s of the first semiconductor pattern 112. The second opening V2 exposes the first drain D1 and the first drain region 112d of the first semiconductor pattern 112. The third opening V3 exposes the first gate G1 and the scan line SL. The fourth opening V4 exposes the second source region 114s and the second signal line L2. The fifth opening V5 exposes the second drain region 114d of the second semiconductor pattern 114. The method of forming the passivation layer 150 includes forming and patterning a passivation material layer (not shown). Note that when patterning the passivation material layer, the underlying aluminum oxide layer 190 is also removed, such that the semiconductor layer 110 and the first conductive layer 130 are exposed. In other words, the passivation layer 150 and the aluminum oxide layer 190 use the same photomask in the manufacturing process. As the patterns on the passivation layer 150 and the aluminum oxide layer 190 are defined simultaneously, one photomask may be omitted in the manufacturing process, and thus the volume of production is increased.

Figure 1E:
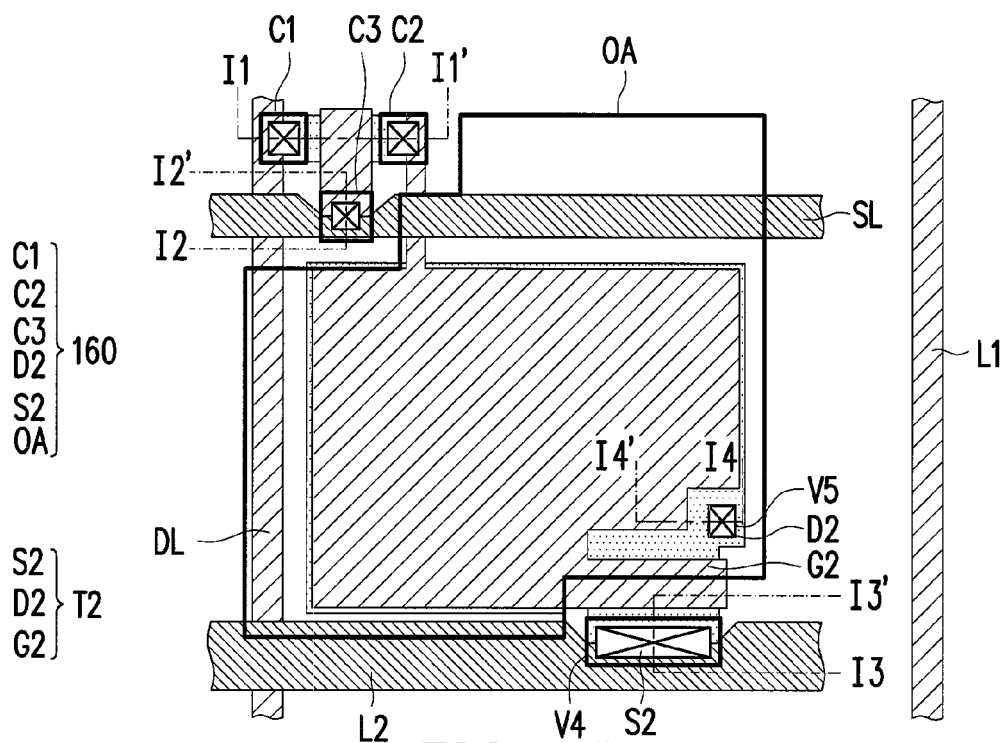
Figure 2E:
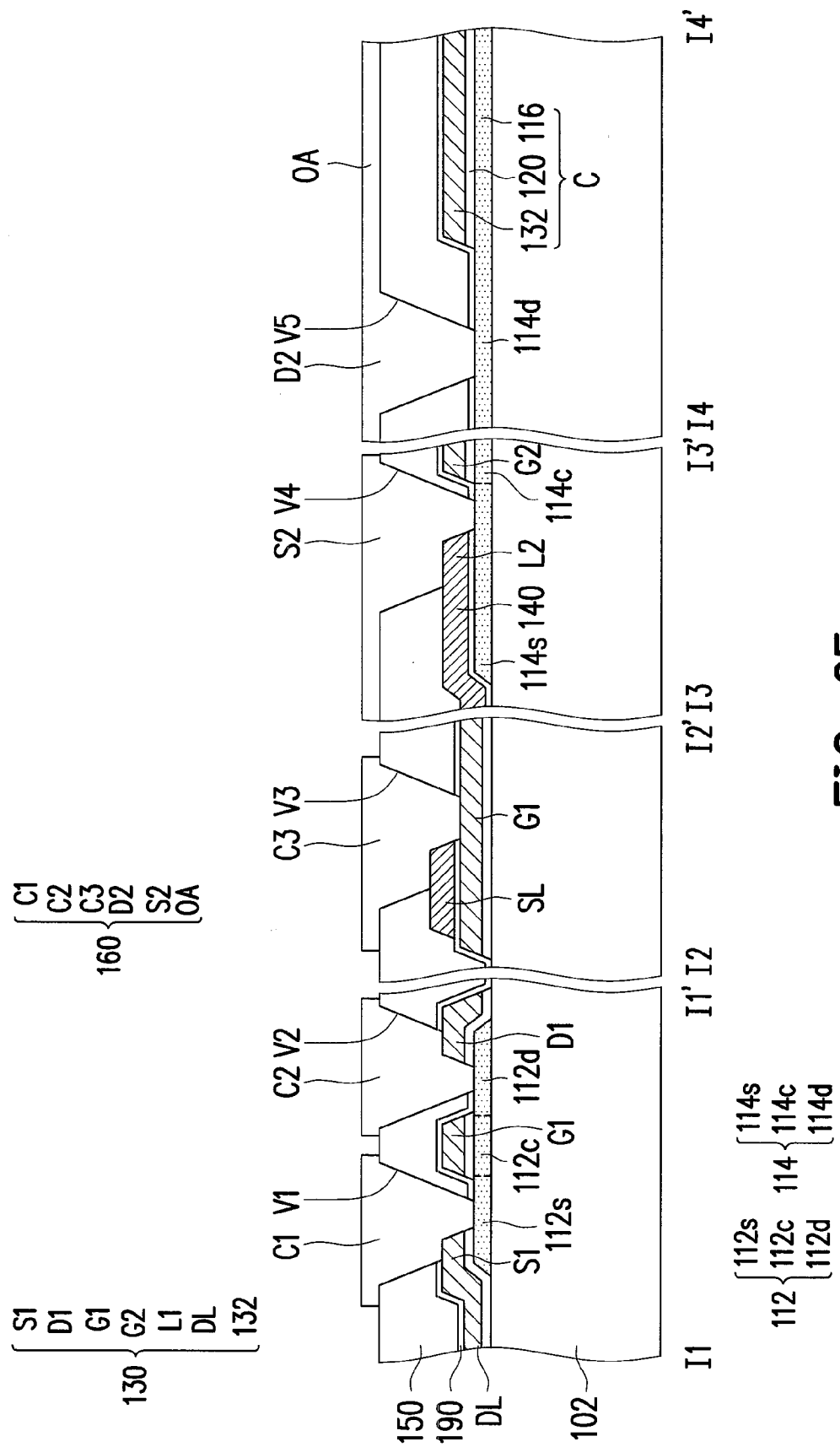

With reference to FIG. 1E and FIG. 2E, a first electrode layer 160 is formed on the passivation layer 150. The first electrode layer 160 fills into the first opening V1, the second opening V2, the third opening V3, the fourth opening V4, and the fifth opening V5. The method of forming the first electrode layer 160 is, for example, forming an electrode material layer (not shown) and patterning this layer to define a first connection structure C1, a second connection structure C2, a third connection structure C3, a second source S2, a second drain D2, and a first electrode OA. More specifically, the first connection structure C1 of the first electrode layer 160 fills into the first opening V1, such that the first source S1 and the first source region 112s are electrically connected to each other. The second connection structure C2 of the first electrode layer 160 fills into the second opening V2, such that the first drain D1 and the first drain region 112d are electrically connected to each other. The third connection structure C3 of the first electrode layer 160 fills into the third opening V3, such that the first gate G1 and scan line SL are electrically connected to each other. The second source S2 of the first electrode layer 160 fills into the fourth opening V4 to electrically connect the second source region 114s; at the same time, the second source region 114s and the second signal line L2 are electrically connected to each other. The second drain D2 of the first electrode layer 160 fills into the fifth opening V5 to electrically connect the second drain region 114d. The second drain D2 is connected to the first electrode OA; therefore, the first electrode OA is electrically connected to the second drain region 114d through the second drain D2.

In the pixel structure described above, the first electrode OA of the first electrode layer 160 overlaps the scan line SL and the data line DL. Therefore, an area of the first electrode OA is increased, which subsequently increases the area of the light emitting region in the pixel structure.

Figure 2F:
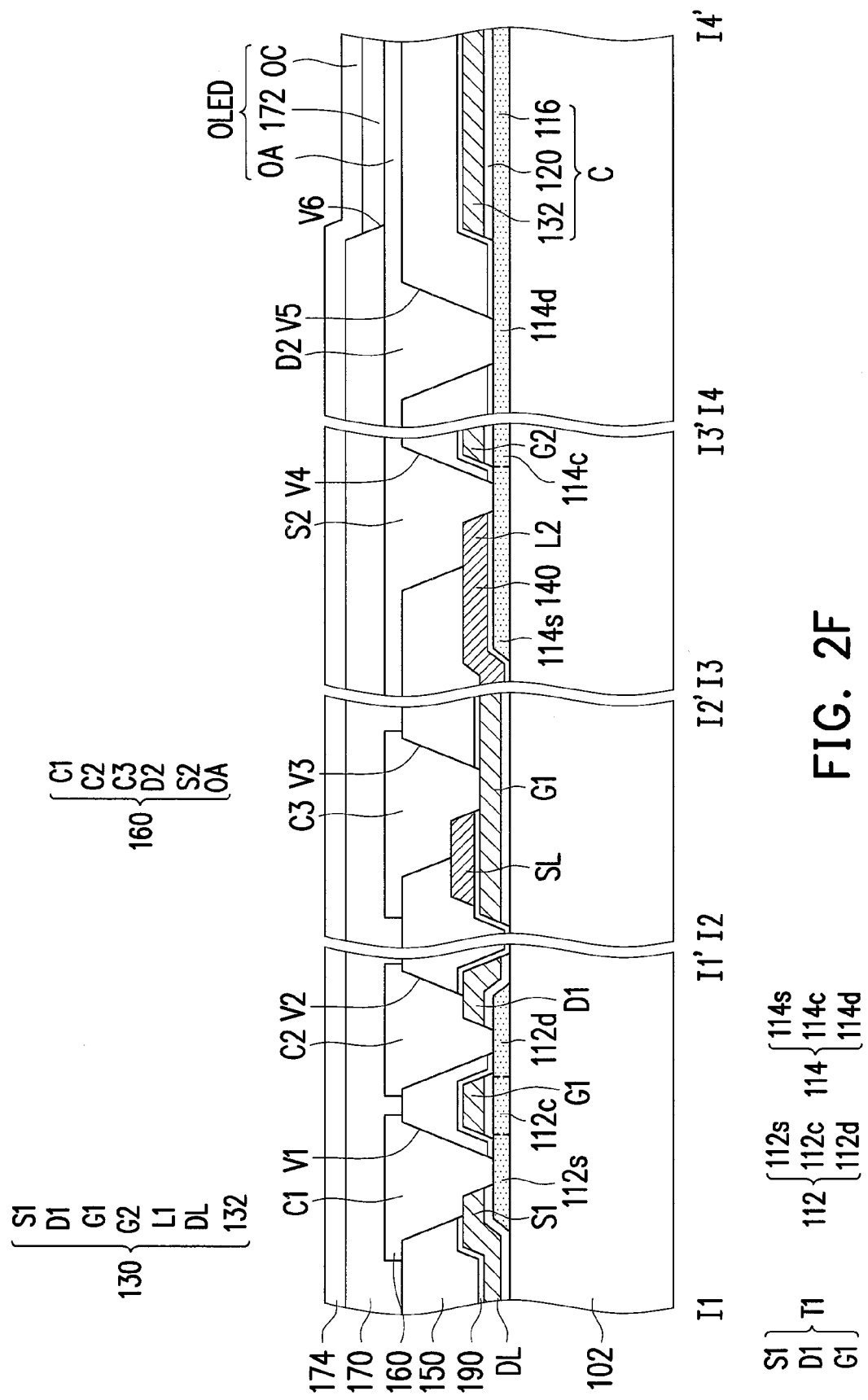
FIG. 2F is a schematic cross-sectional view of a pixel structure in an OLED display panel according to an embodiment of the invention.

If the above pixel structure is applied in an OLED display panel, after performing the step shown in FIG. 2E, the step in FIG. 2F is further performed. This means forming a second insulating layer 170 on the first electrode layer 160, and the second insulating layer 170 has a sixth opening V6 that exposes the first electrode OA. A light emitting layer 172 is then formed at the sixth opening V6, and the light emitting layer 172 can be a red organic light emitting pattern, a green organic light emitting pattern, a blue organic light emitting pattern, or a light emitting pattern in different colors (for example, white, orange, purple, etc.) generated by mixing different spectrum of light. A second electrode layer 174 then covers the light emitting layer 172, wherein the second electrode layer 174 has a second electrode OC, and the second electrode OC is electrically connected the first signal line L1. Here, the first electrode OA, the light emitting layer 172, and the second electrode OC together constitute an organic light emitting diode OLED.

Figure 3:
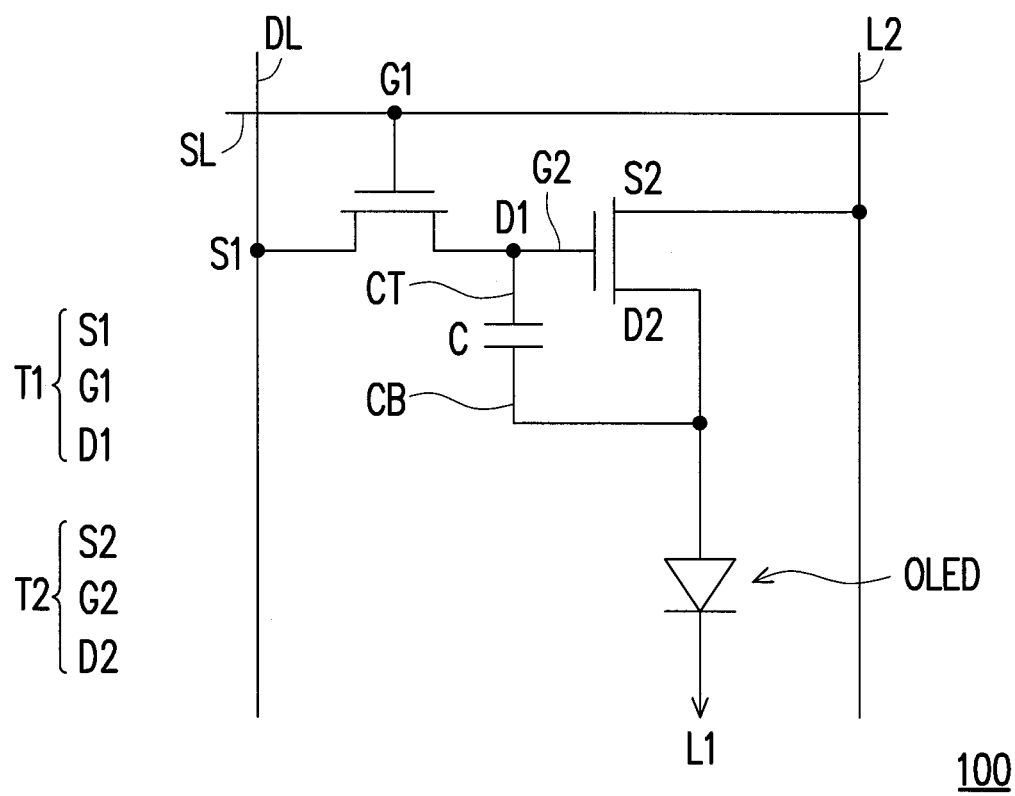
FIG. 3 is an equivalent circuit diagram of a pixel structure in an OLED display panel according to an embodiment of the invention.

FIG. 3 is an equivalent circuit diagram of a pixel structure in an OLED display panel according to an embodiment of the invention. Here, a 2T1C pixel structure is used as an example, where the pixel structure 100 includes a first active device T1, a second active device T2, and a capacitor C. The pixel structure 100 includes a scan line SL, a data line DL, a first active device T1, a second active device T2, a capacitor C, an organic light emitting diode OLED, a first signal line L1, and a second signal line L2. The first active devices T1 and T2 are, for example, top-gate type thin film transistors. The first active device T1 includes a first gate G1, a first source S1, and a first drain D1. The second active device T2 includes a second gate G2, a second source S2, and a second drain D2. The first gate G1 is coupled to the scan line SL. The first source S1 is coupled to the data line DL. The first drain D1 is coupled to the second gate G2 and also coupled to the top electrode CT of the capacitor C (i.e., the top electrode 132 respectively shown in FIG. 1E and FIG. 2E). The second source S2 is coupled to the second signal line L2. The second drain D2 is coupled to the anode of the organic light emitting diode OLED and also coupled to the bottom electrode CB of the capacitor C (i.e., the bottom electrode 116 respectively shown in FIG. 1E and FIG. 2E). The cathode of the organic light emitting diode OLED is coupled to the first signal line L1.

As mentioned above, the first electrode OA of the first electrode layer 160 can overlap the scan line SL and data line DL to increase an area of the light emitting region of the pixel structure. In general, the ratio of an area of the light emitting region in the pixel structure to an area of the entire pixel is known as the aperture ratio. According to the present embodiment, the first electrode layer 160 overlaps the scan line SL and data line DL, which is conducive to an increase in the aperture ratio. For example, in a 55-inch television with the 4k2k resolution, each pixel structure has a length of 160.5 µm and a width of 160.5 µm. The pixel structure formed with use of seven conventional photomasks will have an aperture ratio of approximately 51.8%. However, the aperture ratio of the pixel structure in an embodiment of the invention is 49%. Therefore, the aperture ratio is reduced by less than 6%, and one photomask can be omitted while the volume of production is increased by approximately 14%. In addition, as the panel size increases, the difference in the aperture ratio of the pixel structure described in an embodiment of the invention and the aperture ratio of the pixel structure formed with use of seven photomasks becomes less significant. Therefore, the pixel structure described in an embodiment of the invention is more competitive if the pixel structure is applied to any large panel.

In summary, the passivation layer 150 of the pixel structure in an embodiment of the invention has the first opening V1 and the second opening V2 exposing the first conductive layer 130 and the semiconductor layer 110. The third opening V3 of the passivation layer 150 exposes the first conductive layer 130 and the second conductive layer 140. The fourth opening V4 of the passivation layer 150 exposes the semiconductor layer 110 and the second conductive layer 140. The fifth opening V5 of the passivation layer 150 exposes the semiconductor layer 110. Subsequently, the first electrode layer 160 is bridged between the semiconductor layer 110 and the first conductive layer 130, between the first conductive layer 130 and the second conductive layer 140, and between the semiconductor 110 and the second conductive layer 140. Therefore, the design of the pixel structure described in an embodiment of the invention can reduce the required number of photomasks. Additionally, the first electrode layer 160 can overlap the scan line SL and the data line DL, which is beneficial for the high aperture ratio design of the pixel structure. As a whole, the pixel structure provided in an embodiment of the invention can serve to maintain the high aperture ratio and reduce the number of photomasks in the manufacturing process, and the volume of production can be increased.

Although the embodiments have been disclosed in the invention as shown above, the embodiments are not used to limit the invention. It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A pixel structure comprising:
a semiconductor layer comprising a first semiconductor pattern, the first semiconductor pattern having a first channel region, a first source region, and a first drain region;
an insulating layer disposed on the semiconductor layer;
a first conductive layer disposed on the insulating layer, the first conductive layer comprising a first gate, a first source, a first drain, and a data line connected to the first source;
a second conductive layer disposed above the first conductive layer, the second conductive layer comprising a scan line;
a passivation layer covering the first conductive layer, the second conductive layer, and the semiconductor layer, wherein the passivation layer has a first opening, a second opening, and a third opening, the first opening exposes the first source and the first source region of the first semiconductor pattern, the second opening exposes the first drain and the first drain region of the first semiconductor pattern, and the third opening exposes the first gate and the scan line; and
a first electrode layer disposed on the passivation layer, wherein the first electrode fills into the first opening, the second opening, and the third opening, such that the first source and the first source region are electrically connected to each other, the first drain and the first drain region are electrically connected to each other, and the first gate and the scan line are electrically connected to each other.

2. The pixel structure according to claim 1, wherein the first electrode layer overlaps the scan line and the data line.

3. The pixel structure according to claim 1, wherein
the semiconductor layer further comprising a second semiconductor pattern, the second semiconductor pattern comprising a second channel region, a second source region, and a second drain region;
the first conductive layer further comprising a second gate and a first signal line;
the second conductive layer further comprising a second signal line;
the passivation layer having a fourth opening and a fifth opening, the fourth opening exposing the second source region and the second signal line, the fifth opening exposing the second drain region of the second semiconductor pattern; and
the first electrode layer further comprising a second source, the second source filling into the fourth opening to electrically connect the second signal line, the first electrode layer further comprising a second drain, the second drain filling into the fifth opening to electrically connect the second drain region.

4. The pixel structure according to claim 3, further comprising:
a light emitting layer disposed on the first electrode layer; and
a second electrode layer disposed on the light emitting layer, wherein the second electrode layer and the first signal line are electrically connected to each other.

5. The pixel structure according to claim 4, wherein
the semiconductor layer further comprising a bottom electrode, the bottom electrode being electrically connected to the first electrode layer; and
the first conductive layer further comprising a top electrode, the top electrode being electrically connected to the first drain region, wherein the top electrode and the bottom electrode overlap to form a capacitor.

6. The pixel structure according to claim 1, wherein
the semiconductor layer further comprising a bottom electrode;
the first conductive layer further comprising a top electrode, wherein the top electrode and bottom electrode overlap to form a capacitor.

7. The pixel structure according to claim 1, wherein the first electrode layer comprises:
a first connection structure disposed on the passivation layer to electrically connect the first source and the first source region through the first opening;
a second connection structure disposed on the passivation layer to electrically connect the first drain and the first drain region through the second opening; and
a third connection structure disposed on the passivation layer to electrically connect the first gate and the scan line through the third opening.

8. The pixel structure according to claim 1, wherein the semiconductor layer comprises a metal oxide semiconductor material.

9. The pixel structure according to claim 1, further comprising an aluminum oxide layer disposed on a surface of the first conductive layer.

10. A pixel structure comprising:
a scan line and a data line;
a first active device electrically connected to the scan line and the data line, wherein the first active device comprises:
a first semiconductor pattern having a first channel, a first source region, and a first drain region;
an insulating layer disposed on the first semiconductor pattern; and
a first gate, a first source, and a first drain all disposed on an upper surface of the insulating layer;
a passivation layer covering the first active device, wherein the passivation layer has a first opening, a second opening, and a third opening;
a first connection structure disposed on the passivation layer to electrically connect the first source and the first source region through the first opening;
a second connection structure disposed on the passivation layer to electrically connect the first drain and the first drain region through the second opening; and
a third connection structure disposed on the passivation layer to electrically connect the first gate and the scan line.

11. The pixel structure according to claim 10, further comprising:
a second active device comprising:
a second semiconductor pattern having a second channel region, a second source region, and a second drain region, the insulating layer covering the second semiconductor pattern;
a second gate, a second source, and a second drain all disposed on the insulating layer;
a first signal line and a second signal line both disposed on the insulating layer; and
the passivation layer covering the first signal line and the second signal line and further comprising a fourth opening and a fifth opening, wherein the second source is electrically connected to the second source region and the second signal line through the fourth opening, and the second drain is electrically connected to the second drain region through the fifth opening.

12. The pixel structure according to claim 11, further comprising:
   a first electrode disposed on the passivation layer and connected to the second drain;
   a light emitting layer disposed on the first electrode; and
   a second electrode disposed on the light emitting layer.

13. The pixel structure according to claim 12, wherein the first electrode overlaps the scan line and the data line.

14. The pixel structure according to claim 11, further comprising a capacitor, the capacitor comprising:
   a bottom electrode connected to the second drain region; and
   a top electrode overlapping the bottom electrode.

15. The pixel structure according to claim 10, wherein the first semiconductor pattern comprises a metal oxide semiconductor material.

* * * * *